US012796292B2

(12) United States Patent
Choi

(10) Patent No.: US 12,796,292 B2
(45) Date of Patent: Nov. 10, 2026

(54) DISPLAY DEVICE

(71) Applicant: Samsung Display Co., LTD., Yongin-si (KR)

(72) Inventor: Chul Hyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 383 days.

(21) Appl. No.: 18/413,727

(22) Filed: Jan. 16, 2024

(65) Prior Publication Data

US 2024/0389434 A1 Nov. 21, 2024

(30) Foreign Application Priority Data

May 17, 2023 (KR) ........................ 10-2023-0063575

(51) Int. Cl.
*H10K 59/80* (2023.01)

(52) U.S. Cl.
CPC ....... *H10K 59/8731* (2023.02); *H10K 59/873* (2023.02); *H10K 59/879* (2023.02)

(58) Field of Classification Search
CPC ............. H10K 59/873; H10K 59/8731; H10K 59/879; H10K 50/844; H10K 50/8445; H10K 50/84; H10K 50/841
See application file for complete search history.

(56) References Cited

U.S. PATENT DOCUMENTS 10,418,598 B1 * 9/2019 Ni ...................... H10K 59/8731
11,895,861 B2 * 2/2024 Kim ...................... H10K 59/38
2020/0258946 A1 * 8/2020 Kim ...................... H10K 50/115
2021/0043873 A1 * 2/2021 Sung ...................... H10K 50/115
2021/0217991 A1 * 7/2021 Jung ...................... H10K 59/8731
2021/0399260 A1 * 12/2021 Kim ...................... H10K 59/38
2021/0408476 A1 * 12/2021 Choi ...................... H10K 59/38
(Continued)

FOREIGN PATENT DOCUMENTS

KR 100611768 B1 8/2006
KR 101569406 B1 11/2015
(Continued)

*Primary Examiner* — Joseph C. Nicely

(74) *Attorney, Agent, or Firm* — CANTOR COLBURN LLP

(57) ABSTRACT

A display device includes: a light-emitting element; a first inorganic encapsulation film disposed on the light-emitting element; an organic encapsulation film disposed on the first inorganic encapsulation film; and a second inorganic encapsulation film disposed on the organic encapsulation film. The first inorganic encapsulation film includes: a first inorganic insulating layer on the light-emitting element; a second inorganic insulating layer on the first inorganic insulating layer; a third inorganic insulating layer on the second inorganic insulating layer; a fourth inorganic insulating layer on the third inorganic insulating layer; and a fifth inorganic insulating layer on the fourth inorganic insulating layer. Each of the first inorganic insulating layer, the third inorganic insulating layer and the second inorganic encapsulation film includes silicon nitride ($SiN_x$), and a thickness of the third inorganic insulating layer is greater than a thickness of the second inorganic encapsulation film.

20 Claims, 9 Drawing Sheets

(56) References Cited

U.S. PATENT DOCUMENTS

| | | | | |
|---|---|---|---|---|
| 2022/0140290 | A1* | 5/2022 | Choi | H10K 59/12<br>257/40 |
| 2022/0209204 | A1* | 6/2022 | Kim | H10K 59/8731 |
| 2022/0293890 | A1* | 9/2022 | Jeong | H10K 59/8792 |
| 2022/0376208 | A1* | 11/2022 | Choi | H10K 59/873 |
| 2022/0416001 | A1* | 12/2022 | Kim | H04M 1/0266 |
| 2024/0099104 | A1* | 3/2024 | Jung | H10K 59/873 |
| 2024/0268200 | A1* | 8/2024 | Heo | H10K 59/122 |
| 2024/0357908 | A1* | 10/2024 | Yang | H10K 59/1201 |
| 2024/0389434 | A1* | 11/2024 | Choi | H10K 59/8731 |

FOREIGN PATENT DOCUMENTS

| | | | |
|---|---|---|---|
| KR | 102448066 | B1 | 9/2022 |
| KR | 20220158910 | A | 12/2022 |

* cited by examiner

DISPLAY DEVICE

This application claims priority to Korean Patent Application No. 10-2023-0063575, filed on May 17, 2023, and all the benefits accruing therefrom under 35 U.S.C. § 119, the content of which in its entirety is herein incorporated by reference.

BACKGROUND

1. Field of the Disclosure

The present disclosure relates to a display device.

2. Description of the Related Art

Recently, a display device is used more and more applications. In addition, the thickness of the display device becomes thinner and the weight becomes lighter, and thus the display device is used more and more widely. Therefore, efforts are continuously under way to provide the display device that can be used in various applications.

The display device may include light-emitting elements, and an encapsulation member that encapsulates the light-emitting elements to protect them from outside air or moisture.

Lights emitted from the light-emitting elements (or display elements) are recognized by a user through a thin-film encapsulation layer. Depending on the structure of the thin-film encapsulation layer through which the lights pass, there may be white angle difference ("WAD") that measures/evaluates the amount of change in luminance and color coordinates according to a user's viewing angle compared to the front. Specifically, at the time of full emission, it is desirable that the color is recognized as white. However, a different color than white may be recognized due to the structure of a thin-film encapsulation layer. Such change in luminance and color coordinates may become larger as the viewing angle increases.

SUMMARY

Aspects of the present disclosure provide a display device including a thin-film encapsulation layer that is resistant to permeation of moisture and reduces changes in luminance and color coordinates according to a user's viewing angle.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device includes a light-emitting element disposed on a substrate and including a first electrode, an emissive layer, and a second electrode, a first inorganic encapsulation film disposed on the second electrode of the light-emitting element, an organic encapsulation film disposed on the first inorganic encapsulation film, and a second inorganic encapsulation film disposed on the organic encapsulation film. The first inorganic encapsulation film includes a first inorganic insulating layer on the second electrode of the light-emitting element, a second inorganic insulating layer on the first inorganic insulating layer, a third inorganic insulating layer on the second inorganic insulating layer, a fourth inorganic insulating layer on the third inorganic insulating layer, and a fifth inorganic insulating layer on the fourth inorganic insulating layer, a refractive index of the first inorganic insulating layer is greater than a refractive index of the second inorganic insulating layer, the refractive index of the second inorganic insulating layer is smaller than a refractive index of the third inorganic insulating layer, the refractive index of the third inorganic insulating layer is greater than a refractive index of the fourth inorganic insulating layer, and the refractive index of the second inorganic insulating layer is greater than the refractive index of the fourth inorganic insulating layer.

The refractive index of the fourth inorganic insulating layer may be greater than a refractive index of the fifth inorganic insulating layer.

The display device may further include an auxiliary layer disposed between the second electrode and the first inorganic insulating layer, and the refractive index of the first inorganic insulating layer is greater than a refractive index of the auxiliary layer.

A thickness of the third inorganic insulating layer may be 1.5 to 2.5 times a thickness of the second inorganic encapsulation film.

The thickness of the third inorganic insulating layer may be greater than a sum of thicknesses of the first inorganic insulating layer, the second inorganic insulating layer, the fourth inorganic insulating layer and the fifth inorganic insulating layer.

Each of the first inorganic insulating layer, the third inorganic insulating layer and the second inorganic encapsulation film may include silicon nitride ($SiN_x$).

Each of the second inorganic insulating layer, the fourth inorganic insulating layer and the fifth inorganic insulating layer may include silicon oxynitride ($SiO_xN_y$).

Each of the refractive indices of the first inorganic insulating layer and the third inorganic insulating layer may be equal to or greater than 1.80, the thickness of the first inorganic insulating layer ranges from about 500 angstroms (Å) to about 2,000 Å, and the thickness of the third inorganic insulating layer ranges from about 6,000 Å to about 9,000 Å.

The refractive index of the second inorganic insulating layer may be equal to or greater than 1.70, and the refractive index of the fourth inorganic insulating layer is equal to or less than 1.70.

A thickness of the second inorganic insulating layer may range from about 500 Å to about 2,000 Å, and a thickness of the fourth inorganic insulating layer ranges from about 500 Å to about 1,000 Å.

A refractive index of the fifth inorganic insulating layer may be equal to or less than 1.6, and a thickness of the fifth inorganic insulating layer ranges from about 500 Å to about 1,000 Å.

The first inorganic encapsulation film further may include a sixth inorganic insulating layer on the fifth inorganic insulating layer, and a refractive index of the sixth inorganic insulating layer is smaller than a refractive index of the fifth inorganic insulating layer.

A thickness of the second inorganic encapsulation film may range from is about 3,000 Å to about 8,000 Å.

The organic encapsulation film may include an organic polymer, and the auxiliary layer is made of lithium fluoride (LiF).

The first inorganic insulating layer, the third inorganic insulating layer and the second inorganic encapsulation film may have a same refractive index.

According to an embodiment of the disclosure, a display device includes: a light-emitting element disposed on a substrate and including a first electrode, an emissive layer, and a second electrode, a first inorganic encapsulation film disposed on light-emitting element, an organic encapsulation film disposed on the first inorganic encapsulation film, and a second inorganic encapsulation film disposed on the organic encapsulation film. The first inorganic encapsulation film includes a first inorganic insulating layer on the second electrode, a second inorganic insulating layer on the first inorganic insulating layer, a third inorganic insulating layer on the second inorganic insulating layer, a fourth inorganic insulating layer on the third inorganic insulating layer, and a fifth inorganic insulating layer on the fourth inorganic insulating layer, each of the first inorganic insulating layer, the third inorganic insulating layer and the second inorganic encapsulation film includes silicon nitride ($SiN_x$), and a thickness of the third inorganic insulating layer is greater than a thickness of the second inorganic encapsulation film.

The thickness of the third inorganic insulating layer may be greater than a sum of thicknesses of the first inorganic insulating layer, the second inorganic insulating layer, the fourth inorganic insulating layer and the fifth inorganic insulating layer.

The second inorganic insulating layer, the fourth inorganic insulating layer and the fifth inorganic insulating layer may include silicon oxynitride ($SiON_x$).

A refractive index of the first inorganic insulating layer may be greater than a refractive index of the second inorganic insulating layer, the refractive index of the second inorganic insulating layer is smaller than a refractive index of the third inorganic insulating layer, the refractive index of the second inorganic insulating layer is greater than a refractive index of the fourth inorganic insulating layer, and the refractive index of the third inorganic insulating layer is greater than the refractive index of the fourth inorganic insulating layer, the refractive index of each of the first inorganic insulating layer and the third inorganic insulating layer is equal to or greater than 1.80, the refractive index of the second inorganic insulating layer is equal to or greater than 1.70, and the refractive index of the fourth inorganic insulating layer is equal to or less than 1.70.

The refractive index of the fourth inorganic insulating layer may be greater than a refractive index of the fifth inorganic insulating layer, and the refractive index of the fifth inorganic insulating layer is equal to or less than 1.6.

Other features and embodiments may be apparent from the following detailed description and the drawings.

According to an embodiment of the present disclosure, a change in luminance and color coordinates according to a viewing angle of a display device can be effectively reduced by disposing a high-refractive-index layer between low-refractive-index layers.

According to an embodiment of the present disclosure, a display device that is robust against moisture can be effectively achieved by disposing a high-refractive-index layer between low-refractive-index layers.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

In this specification, the numerical range "$a_1$ to $a_2$" means a range greater than or equal to $a_1$ and less than or equal to $a_2$. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, embodiments will be described with reference to the accompanying drawings.

Figure 1:
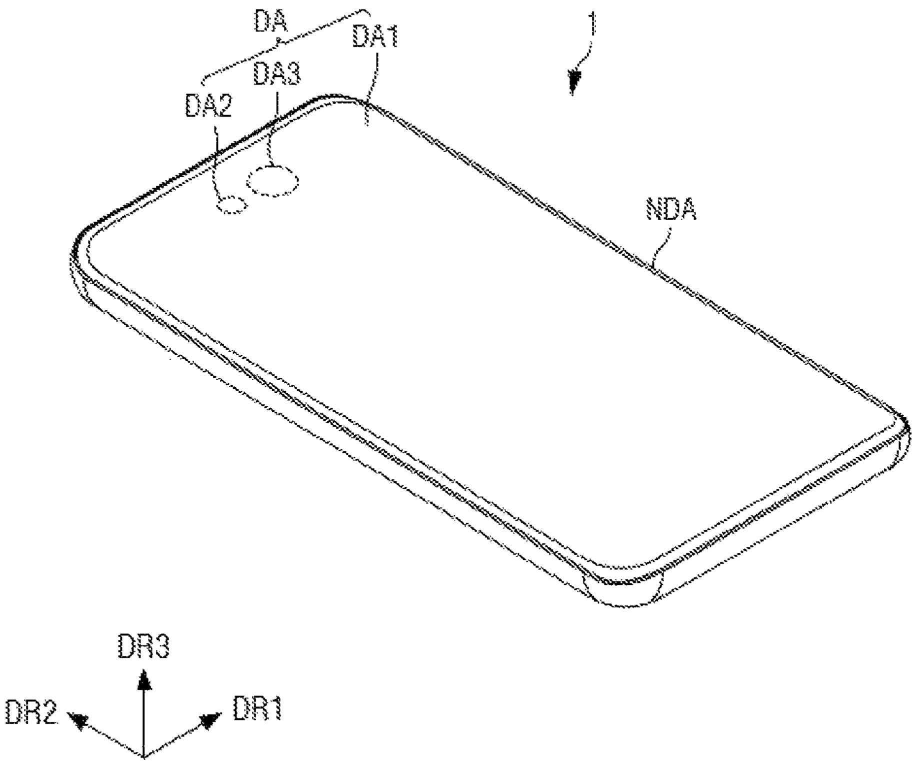
FIG. 1 is a perspective view of an electronic device according to an embodiment of the present disclosure.

FIG. 1 is a plan view of a display device according to an embodiment of the present disclosure.

Referring to FIG. 1, an electronic device 1 displays a moving image or a still image. The electronic device 1 may refer to any electronic device that provides a display screen. For example, the electronic device 1 may include a television set, a laptop computer, a monitor, an electronic billboard, the Internet of Things devices, a mobile phone, a smart phone, a tablet personal computer ("PC"), an electronic watch, a smart watch, a watch phone, a head-mounted display device, a mobile communications terminal, an electronic notebook, an electronic book, a portable multimedia player ("PMP"), a navigation device, a game console and a digital camera, a camcorder, etc.

The electronic device 1 may include a display device 10 (see FIG. 2) for providing a display screen. Examples of the display device may include an inorganic light-emitting diode display device, an organic light-emitting display device, a quantum-dot light-emitting display device, a plasma display device, a field emission display device, etc. In the following description, an organic light-emitting diode display device is employed as an example of the display device 10, but the present disclosure is not limited thereto. Any other display device may be employed as long as the technical idea of the present disclosure can be equally applied.

The shape of the electronic device 1 may be modified in a variety of ways. For example, the electronic device 1 may have shapes such as a rectangle with longer lateral sides, a rectangle with longer vertical sides, a square, a quadrangle with rounded corners (vertices), other polygons, a circle, etc. The shape of a display area DA of the electronic device 1 may also be similar to the overall shape of the electronic device 1. In the example shown in FIG. 1, the electronic device 1 has a rectangular shape with the longer sides in a second direction DR2.

The electronic device 1 may include the display area DA and a non-display area NDA. In the display area DA, images are displayed. In the non-display area NDA, images are not displayed. The display area DPA may be referred to as an active area, while the non-display area NDA may also be referred to as an inactive area. The display area DA may generally occupy the center of the electronic device 1.

The display area DA may include a first display area DA1, a second display area DA2 and a third display area DA3. In the second display area DA2 and the third display area DA3, components for adding a variety of features to the electronic device 1 may be disposed. In other words, the second display area DA2 and the third display area DA3 may be referred to as component areas. The components may be an optical device 500 shown in FIG. 3.

Figure 2:
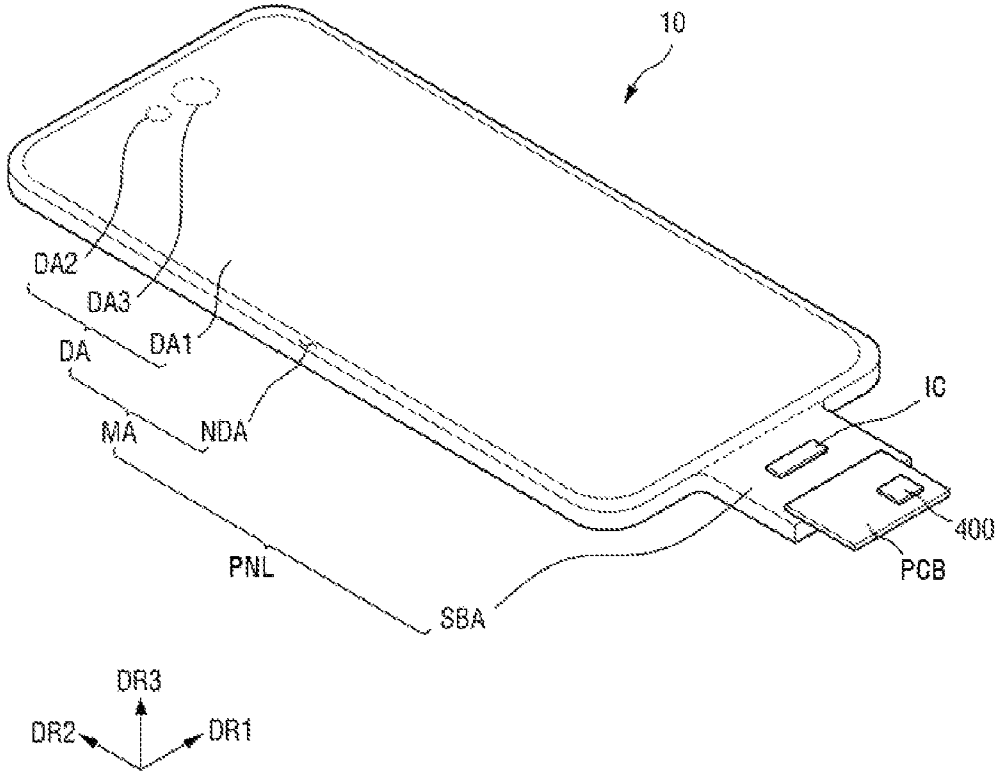
FIG. 2 is a perspective view showing a display device included in an electronic device according to an embodiment of the present disclosure.

FIG. 2 is a perspective view showing a display device included in an electronic device according to an embodiment of the present disclosure.

Referring to FIG. 2, the electronic device 1 according to the embodiment of the present disclosure may include a display device 10. The display device 10 may provide a display screen where images are displayed in the electronic device 1. The display device 10 may have a shape similar to the shape of the electronic device 1 when viewed from the top. For example, the display device 10 may have a shape similar to a rectangle having shorter sides in the first direction DR1 and longer sides in the second direction DR2. The corners where the shorter sides in the first direction DR1 meet the longer sides in the second direction DR2 may be rounded with a predetermined curvature. It should be understood, however, that the present disclosure is not limited thereto. The corners may be formed at a right angle in another embodiment. The shape of the display device 10 when viewed from the top is not limited to a quadrangular shape, but may be formed in a shape similar to other polygonal shapes, a circular shape, or an elliptical shape.

The display device 10 may include a display panel PNL, a display driver IC, a circuit board PCB and a touch driver 400.

The display panel PNL may include a main area MA and a subsidiary area SBA.

The main area MA may include the display area DA including pixels for displaying images, and the non-display area NDA located around the display area DA. The display area DA may include the first display area DA1, the second display area DA2 and the third display area DA3. The display area DA may output lights from a plurality of emission areas or a plurality of open areas. For example, the display panel PNL may include a pixel circuit including switching elements, a pixel-defining layer that defines the emission areas or the opening areas, and a self-light-emitting element.

For example, the self-light-emitting element may include, but is not limited to, at least one of: an organic light-emitting diode including an organic emissive layer, a quantum-dot light-emitting diode (quantum LED) including a quantum-dot emissive layer, an inorganic light-emitting diode (inorganic LED) including an inorganic semiconductor, and a micro light-emitting diode (micro LED).

The non-display area NDA may be disposed on the outer side of the display area DA. The non-display area NDA may be defined as the edge area of the main area MA of the display panel PNL. The non-display area NDA may include a scan driver 210 (see FIG. 4) providing scan signals to scan lines, and fan-out lines FOL (see FIG. 4) connecting a display driver IC to the display area DA.

The subsidiary area SBA may be extended from one side of the main area MA. The subsidiary area SUB may include a flexible material that can be bent, folded, or rolled. For example, when the subsidiary area SBA is bent, the subsidiary area SBA may overlap the main area MA in the thickness direction (third direction DR3). The subsidiary area SBA may include pads connected to the display driver IC and the circuit board PCB. According to another embodiment, the subsidiary area SBA may be eliminated, and the display driver IC and the pads may be disposed in the non-display area NDA.

The display driver IC may output signals and voltages for driving the display panel PNL. The display driver IC may supply data voltages to data lines. The display driver IC may apply a supply voltage to a supply voltage line, and may supply a scan control signal to the scan driver. The display driver IC may be implemented as an integrated circuit ("IC") and may be attached on the display panel PNL by a chip-on-glass ("COG") technique, a chip-on-plastic ("COP") technique, or ultrasonic bonding. For example, the display driver IC may be disposed in the subsidiary area SBA and may overlap with the main area MA in the thickness direction (third direction DR3) as the subsidiary area SBA is bent. For another example, the display driver IC may be mounted on the circuit board PCB.

The circuit board PCB may be attached on the pad area of the display panel PNL using an anisotropic conductive film ("ACF"). Lead lines of the circuit board PCB may be electrically connected to the pad areas of the display panel PNL. The circuit board PCB may be a flexible printed circuit board ("FPCB"), a printed circuit board ("PCB"), or a flexible film such as a chip-on-film ("COF").

The touch driver 400 may be mounted on the circuit board PCB. The touch driver 400 may be connected to a touch sensing unit of the display panel PNL. The touch driver 400 may supply a touch driving signal to a plurality of touch electrodes of the touch sensing unit and may sense a change in the capacitance between the plurality of touch electrodes. For example, the touch driving signal may be a pulse signal having a predetermined frequency. The touch driver 400 may determine whether a touch is input and may find the coordinates of the touch based on the amount of the change in the capacitance between the touch electrodes. The touch driver 400 may be implemented as an integrated circuit (IC).

Figure 3:
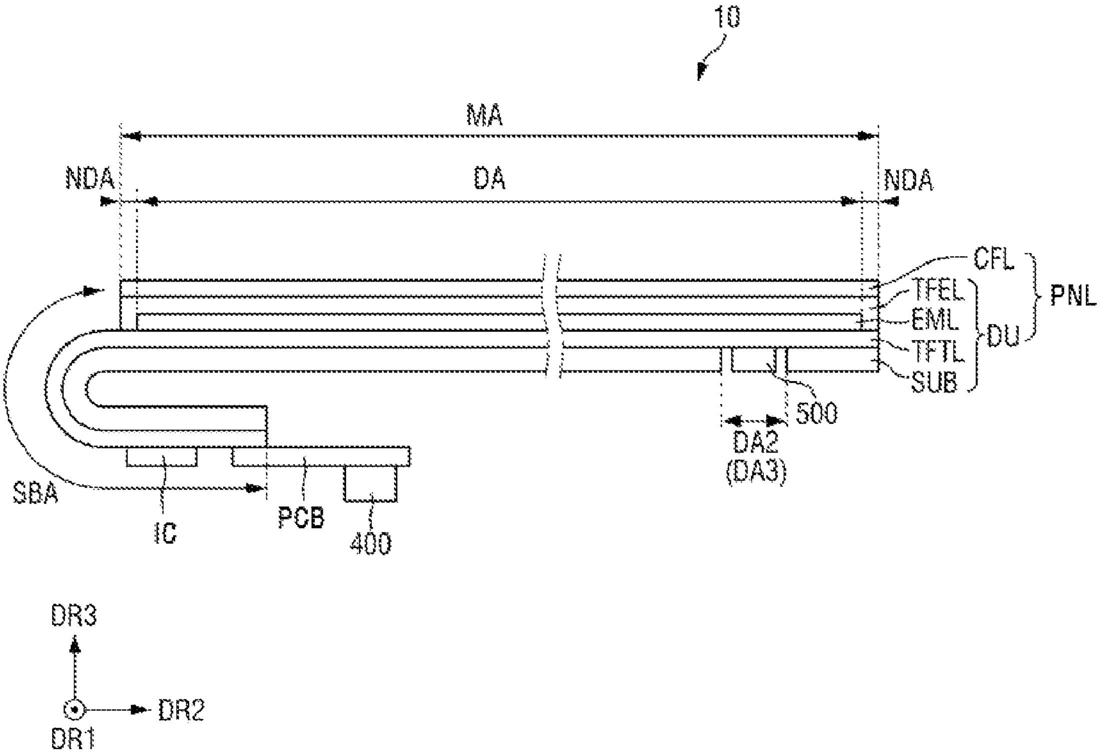
FIG. 3 is a cross-sectional view of the display device of FIG. 2 seen from the side.

FIG. 3 is a cross-sectional view of the display device of FIG. 2 seen from the side.

Referring to FIG. 3, the display panel PNL may include a display layer DU and a color filter layer CFL. The display layer DU may include a substrate SUB, a thin-film transistor layer TFTL, an emission material layer EML and a thin-film encapsulation layer TFEL.

The substrate SUB may be a base substrate or a base member. The substrate SUB may be a flexible substrate that can be bent, folded, or rolled. For example, the substrate SUB may include, but is not limited to, a polymer resin such as polyimide PI. According to another embodiment, the substrate SUB may include a glass material or a metal material.

The thin-film transistor layer TFTL may be disposed on the substrate SUB. The thin-film transistor layer TFTL may include a plurality of thin-film transistors forming pixel circuits of pixels. The thin-film transistor layer TFTL may further include scan lines, data lines, voltage lines, scan control lines, fan-out lines for connecting the display driver IC with the data lines, lead lines for connecting the display driver IC with the pads, etc. Each of the thin-film transistors may include a semiconductor region, a source electrode, a drain electrode, and a gate electrode. For example, when the scan driver is formed on one side of the non-display area NDA of the display panel PNL, the scan driver may include thin-film transistors.

The thin-film transistor layer TFTL may be disposed in the display area DA, the non-display area NDA and the subsidiary area SBA. The thin-film transistors in the pixels, the scan lines, the data lines, and the power supply lines on the thin-film film transistor layer TFTL may be disposed in the display area DA. The scan control lines and the fan-out lines in the thin-film transistor layer TFTL may be disposed in the non-display area NDA. The lead lines of the thin-film transistor layer TFTL may be disposed in the subsidiary area SBA.

The emission material layer EML may be disposed on the thin-film transistor layer TFTL. The emission material layer EML may include a plurality of light-emitting elements each including a first electrode, a second electrode and an emissive layer to emit light, and a pixel-defining layer for defining the pixels. The plurality of light-emitting elements in the emission material layer EML may be disposed in the display area DA.

According to an embodiment of the present disclosure, the emissive layer may be an organic emissive layer containing an organic material. The emissive layer may include a hole transporting layer, an organic light-emitting layer and an electron transporting layer. When the first electrode receives a voltage and the second electrode receives a cathode voltage through the thin-film transistors on the thin-film transistor layer TFTL, the holes and electrons may move to the organic light-emitting layer through the hole transporting layer and the electron transporting layer, respectively, such that they combine in the organic light-emitting layer to emit light.

According to another embodiment, the light-emitting elements may include quantum-dot light-emitting diodes each including a quantum-dot emissive layer, inorganic light-emitting diodes each including an inorganic semiconductor, or micro light-emitting diodes.

The thin-film encapsulation layer TFEL may cover the upper and side surfaces of the emission material layer EML, and can protect the emission material layer EML. The thin-film encapsulation layer TFEL may include at least one inorganic layer and at least one organic layer for encapsulating the emission material layer EML.

A touch sensing layer TSU may be disposed on the display layer DU. The touch sensing layer TSU may obtain the coordinates of the touch input point by capacitive sensing. The capacitive sensing can obtain coordinate information of a touched point by self-capacitance manner or mutual-capacitance manner. It should be understood, however, that the present disclosure is not limited thereto.

The color filter layer CFL may be disposed on the thin-film encapsulation layer TFEL. The color filter layer CFL may include a plurality of color filters associated with the plurality of emission areas, respectively. Each of the color filters may selectively transmit light of a particular wavelength and block or absorb lights of other wavelengths. The color filter layer CFL may absorb some of lights introduced from the outside of the display device 10 to reduce the reflection of external light. Accordingly, the color filter layer CFL can prevent distortion of colors due to the reflection of external light.

Since the color filter layer CFL is disposed directly on the thin-film encapsulation layer TFEL, the display device 10 may require no separate substrate for the color filter layer CFL. Therefore, the thickness of the display device 10 can be relatively small.

In some embodiments, the display device 10 may further include an optical device 500. The optical device 500 may be disposed in the second display area DA2 or the third display area DA3. The optical device 500 may output or receive light in infrared, ultraviolet, and visible ranges. For example, the optical device 500 may be an optical sensor that senses light incident on the display device 10, such as a proximity sensor, an illuminance sensor, a camera sensor, a finger sensor and an image sensor.

Figure 4:
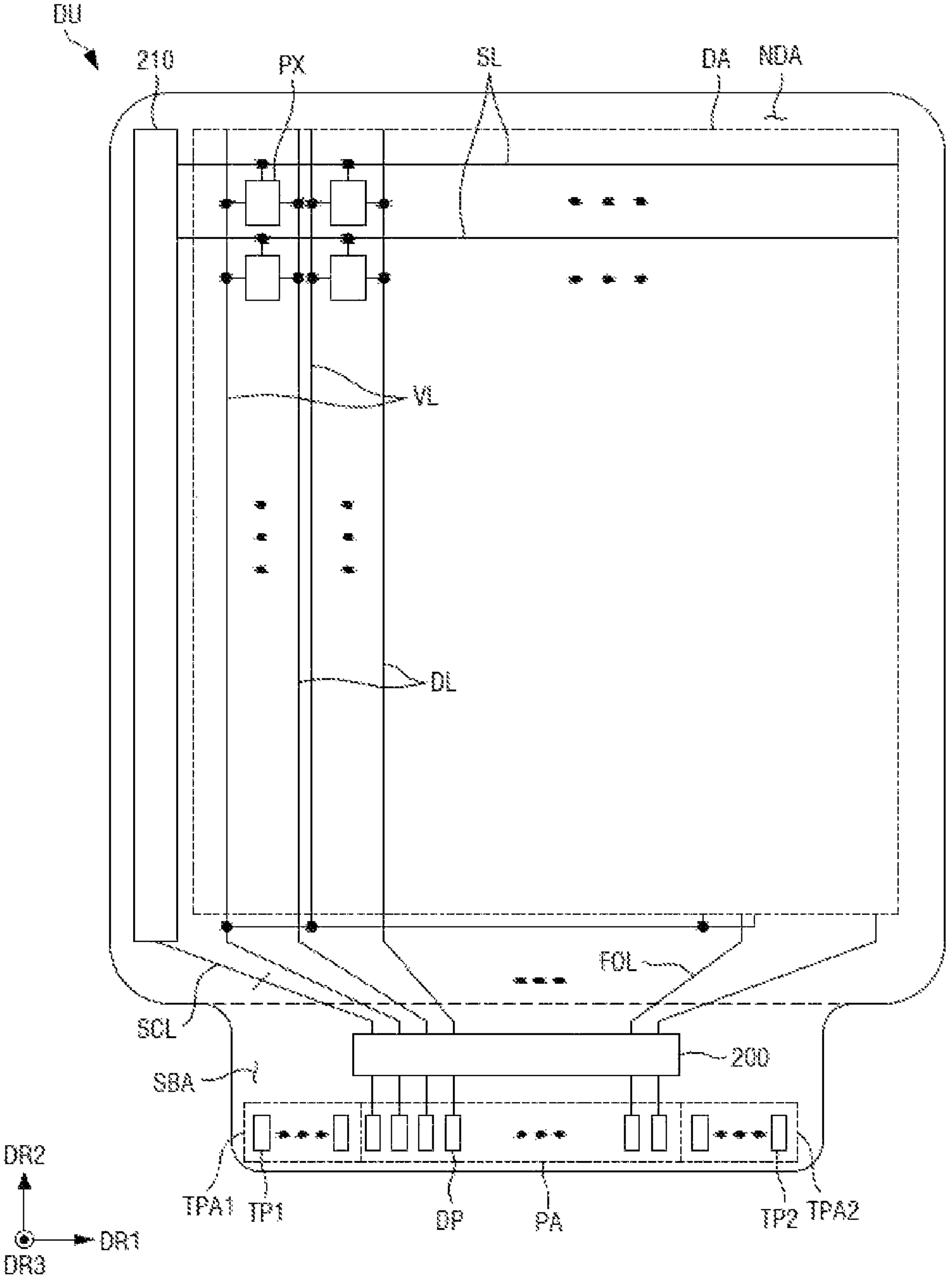
FIG. 4 is a plan view showing a display layer of a display device according to an embodiment of the present disclosure.

FIG. 4 is a plan view showing a display layer of a display device according to an embodiment of the present disclosure.

Referring to FIG. 4, the display layer DU may include a display area DA and a non-display area NDA.

The display area DA may be disposed at the center of display panel PNL. In the display area DA, a plurality of pixels PX, a plurality of scan lines SL, a plurality of data lines DL and a plurality of voltage lines VALUE may be disposed. Each of the plurality of pixels PX may be defined as the minimum unit that outputs light.

The plurality of scan lines SL may provide the scan signals received from the scan driver 210 to the plurality of pixels PX. The plurality of scan lines SL may be extended in the first direction DR1 and may be spaced apart from one another in the second direction DR2 intersecting the first direction DR1.

The plurality of data lines DL may provide the data voltages received from the display driver IC to the plurality of pixels PX. The plurality of data lines DL may be extended in the second direction DR2 and may be spaced apart from one another in the first direction DR1.

The plurality of voltage lines VL may provide the supply voltage received from the display driver IC to the plurality of pixels PX. The supply voltage may be at least one of a driving voltage, an initialization voltage, a reference voltage and a low-level voltage. The plurality of voltage lines VL may be extended in the second direction DR2 and may be spaced apart from one another in the first direction DR1.

The non-display area NDA may surround the display area DA. In the non-display area NDA, the scan driver 210, fan-out lines FOL, and scan control lines GCL may be disposed. The scan driver 210 may generate a plurality of scan signals based on a scan control signal, and may sequentially supply the scan signals to the scan lines SL in a predetermined order.

The fan-out lines FOL may be extended from the display driver IC to the display area DA. The fan-out lines FOL may supply the data voltage received from the display driver IC to the plurality of data lines DL.

A scan control line SCL may be extended from the display driver IC to the scan driver 210. The scan control line SCL may provide the scan control signal received from the display driver IC to the scan driver 210.

The subsidiary area SBA may include the display driver IC, a pad area DPA, and first and second touch pad areas TPA1 and TPA2.

The display driver IC may output signals and voltages for driving the display panel PNL to the fan-out lines FOL. The display driver IC may supply data voltages to the data lines DL through the fan-out lines FOL. The data voltages may be applied to the plurality of pixels PX, so that the luminance of the plurality of pixels PX may be controlled. The display driver IC may supply a scan control signal to the scan driver 210 through the scan control line SCL.

The pad area DPA, the first touch pad area TPA1 and the second touch pad area TPA2 may be disposed at the edge of the subsidiary area SBA. The pad area PA, the first touch pad area TPA1 and the second touch pad area TPA2 may be electrically connected to the circuit board PCB using a material such as an anisotropic conductive film and a self-assembly anisotropic conductive paste ("SAP").

The pad area DPA may include a plurality of display pads DP. The plurality of display pads DP may be connected to a graphic system through the circuit board PCB. The plurality of display pads DP may be connected to the circuit board PCB to receive digital video data and may supply the digital video data to the display driver IC.

Figure 5:
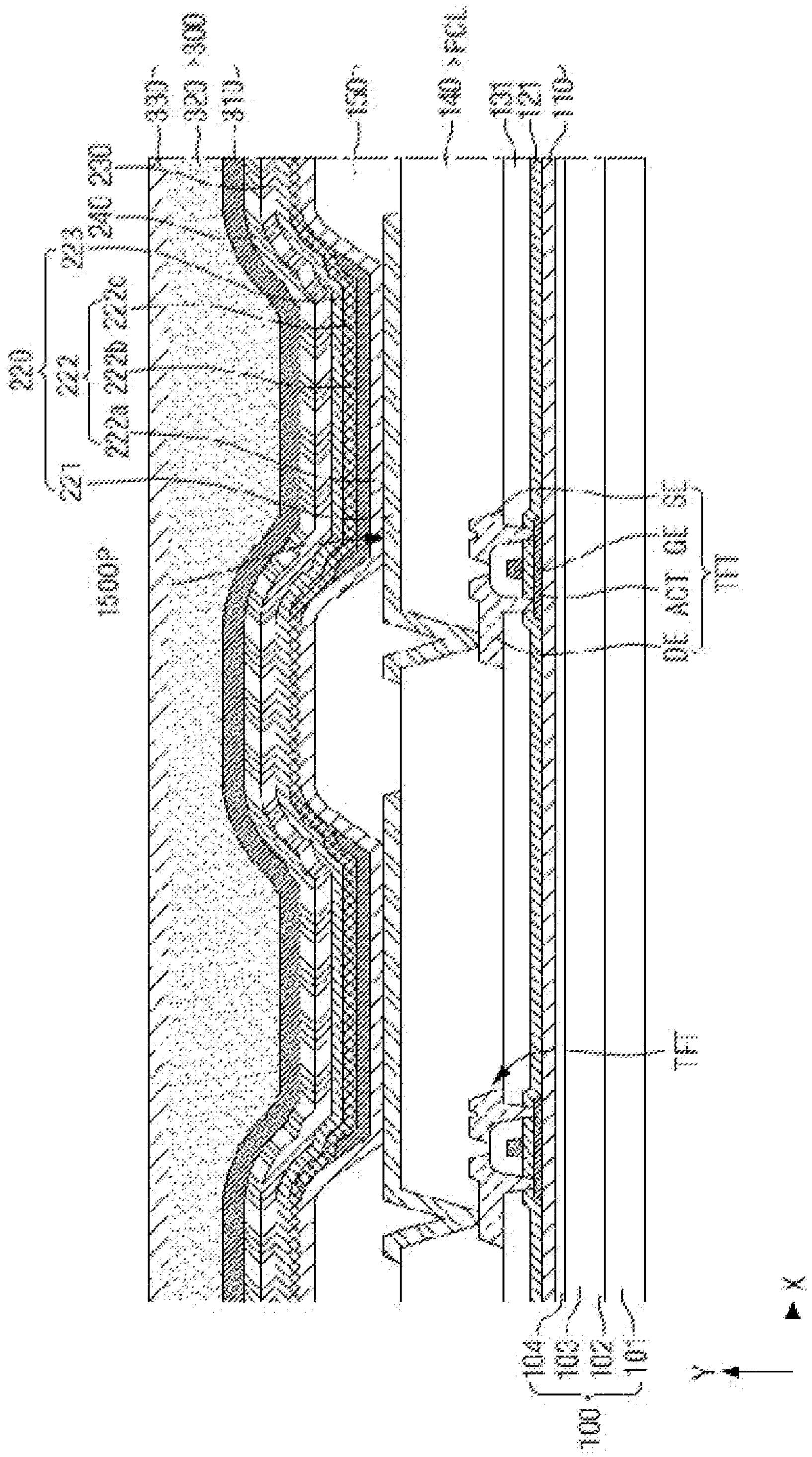
FIG. 5 is a plan view showing a display area of a display device to an embodiment of the present disclosure.

FIG. 5 is a cross-sectional view showing a part of a display device according to an embodiment of the present disclosure.

Referring to FIG. 5, a pixel circuit layer PCL including a pixel circuit may be disposed on a substrate 100, and a display element layer 200 may be disposed on the pixel circuit layer PCL. The organic light-emitting diode as a light-emitting element 220 is disposed on the pixel circuit layer PCL and covered with an encapsulation layer 300. The display element layer 200 may include a light-emitting element (organic light-emitting diode) 220, a capping layer 230 and an auxiliary layer 240. The capping layer 230 may be disposed between a cathode electrode 223 of the light-emitting element (organic light-emitting diode) 220 and the encapsulation layer 300, and the auxiliary layer 240 may be disposed between the capping layer 230 and the encapsulation layer 300.

The substrate 100 may be a base substrate or a base member. The substrate 100 may be a flexible substrate that can be bent, folded, or rolled.

According to an embodiment of the present disclosure, the substrate 100 may include a first base layer 101, a first barrier layer 102, a second base layer 103, and a second barrier layer 104 as shown in FIG. 5. Each of the first base layer 101 and the second base layer 103 may include a polymer resin. For example, the first base layer 101 and the second base layer 103 may include a polymer resin such as polyethersulfone ("PES"), polyarylate ("PAR"), polyetherimide ("PEI"), polyethylene naphthalate ("PEN"), polyethylene terephthalate ("PET"), polyphenylene sulfide ("PPS"), polyimide ("PI"), polycarbonate, cellulose triacetate ("TAC"), and cellulose acetate propionate ("CAP"). Each of the first barrier layer 102 and the second barrier layer 104 may be a barrier layer that prevent permeation of outside foreign substances, and may be made up of a single layer or multiple layers including inorganic materials such as silicon nitride and silicon oxide.

In some embodiments, the substrate 100 may be a single layer including a glass material. For example, the substrate 100 may be a glass substrate containing $SiO_2$ as a main component.

The pixel circuit layer PCL on the substrate 100 may include a thin-film transistor TFT and may include a storage capacitor (not shown) connected to the thin-film transistor TFT. The thin-film transistor TFT may have the same structure for different pixels. Each thin-film transistor TFT may be connected to a display element included in each pixel.

The thin-film transistor TFT may include a semiconductor layer ACT including amorphous silicon, polycrystalline silicon or an organic semiconductor material, a gate electrode GE, a source electrode SE, and a drain electrode DE. In order to achieve insulation between the semiconductor layer ACT and the gate electrode GE, the gate insulator 121 containing an inorganic material such as silicon oxide, silicon nitride and/or silicon oxynitride may be interposed between the semiconductor layer ACT and the gate electrode GE. An interlayer dielectric layer 131 containing an inorganic material such as silicon oxide, silicon nitride and/or silicon oxynitride may be disposed over the gate electrode GE, and the source electrode SE and the drain electrode DE may be disposed on the above-described interlayer dielectric layer 131. The insulating layer containing an inorganic material may be formed by chemical vapor deposition ("CVD") or atomic layer deposition ("ALD").

The gate electrode GE, the source electrode SE and the drain electrode DE may be formed of various conductive materials. The gate electrode GE may include molybdenum or aluminum and may have a single layer or multilayer structure. For example, the gate electrode GE may be made up of a single layer of molybdenum or a three-layer structure including a molybdenum layer, an aluminum layer, and a molybdenum layer. The source electrode SE and the drain electrode DE may include titanium or aluminum, and may have a single-layer or multi-layer structure. According to an embodiment of the present disclosure, the source electrode SE and the drain electrode DE may have a three-layer structure including a titanium layer, an aluminum layer and a titanium layer.

A buffer layer 110 containing an inorganic material such as silicon oxide, silicon nitride and/or silicon oxynitride may be interposed between the thin-film transistor TFT having the above-described structure and the substrate 100. The buffer layer 110 can increase the smoothness of the upper surface of the substrate 100 or can prevent or suppress the permeation of impurities from the substrate 100 into the semiconductor layer ACT of the thin-film transistor TFT.

A planarization insulating layer 140 may be disposed over the thin-film transistor TFT. The planarization insulating layer 140 may be formed of, for example, an organic material such as acrylic, benzocyclobutene ("BCB"), and hexamethyldisiloxane ("HMDSO"). Although the planarization insulating layer 140 is a single layer in the example shown in FIG. 3, it may be made up of multiple layers.

The display element layer 200 may be disposed on the thin-film transistor layer TFT. The display element layer 200 may include a light-emitting element 220. According to an embodiment of the present disclosure, the light-emitting element may be a light-emitting element 220 (e.g., organic light-emitting diode).

The light-emitting element 220 (e.g., organic light-emitting diode) may include a first electrode 221, an intermediate layer 222, and a second electrode 223. The first electrode 221 may be a "pixel electrode" or an "anode electrode". The second electrode 223 may be a "common electrode" if the first electrode 221 is the pixel electrode, and may be a "cathode electrode" if the first electrode 221 is the anode electrode. In the following description, the first electrode 221 is referred to as the pixel electrode 221 and the second electrode 223 is referred to as the cathode electrode or the common electrode 223.

The pixel electrode 221 may be disposed on the planarization insulating layer 140 and may be disposed in each pixel. The pixel electrode 221 may be a reflective electrode. According to an embodiment of the present disclosure, the pixel electrode 221 may include a reflective film containing silver (Ag), magnesium (Mg), aluminum (Al), platinum (Pt), palladium (Pd), gold (Au), nickel (Ni), neodymium (Nd), iridium (Ir), chromium (Cr) or a compound thereof. As another example, the pixel electrode 221 may include a transparent or translucent electrode layer disposed on or/and under the reflective film. The transparent or translucent electrode layer may include at least one selected from the group consisting of: indium tin oxide ("ITO"), indium zinc oxide ("IZO"), zinc oxide (ZnO), indium oxide ($In_2O_3$), indium gallium oxide ("IGO") and aluminum zinc oxide ("AZO"). According to some embodiments, the pixel electrode 221 may have a three-layer structure of an ITO layer, an Ag layer and an ITO layer.

A pixel-defining film 150 is disposed on the pixel electrodes 221. The pixel-defining film 150 defines an opening 150OP exposing a central portion of each pixel electrode 221. The pixel-defining film 150 may increase the distance between an edge of the pixel electrode 221 and the common electrode 223 to prevent an electric arc from occurring at the edge of the pixel electrode 221. The pixel-defining film 150 may be formed of an organic insulating material such as polyimide, polyamide, acrylic resin, benzocyclobutene, hexamethyldisiloxane (HMDSO), and phenol resin by spin coating or the like.

An emissive layer 222*b* may be disposed on the pixel electrode 221 exposed through the opening 150OP of the pixel-defining film 150. The emissive layer 222*b* may be an organic material including a fluorescent or phosphorescent material that can emit red, green, or blue light. The above-described organic material may be a low-molecular weight organic material or a high-molecular weight organic material.

A first functional layer 222*a* and a second functional layer 222*c* may be disposed on and under the emissive layer 222*b*, respectively. The first functional layer 222*a* may include, for example, a hole transport layer HTL and/or a hole injection layer HIL. The second functional layer 222*c* is an element disposed on the emissive layer 222*b* and may include an electron transport layer ETL and/or an electron injection layer EIL. The second functional layer 222*c* is optional. In some embodiments, the second functional layer 222*c* may not be disposed.

While the emissive layer 222*b* is disposed in each opening of the pixel-defining film 150, each of the first functional layer 222*a* and the second functional layer 222*c* may be, for example, a common layer integrally formed to entirely cover the display area of the substrate 100 so that it entirely covers the substrate 100, like a common electrode 223 to be described later. In some embodiments, like the first functional layer 222*a* and the second functional layer 222*c*, the emissive layer 222*b* may be integrally formed to entirely cover the display area of the substrate 100 so that it entirely covers the substrate 100.

The common electrode 223 may include a transparent (translucent) layer such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy thereof. Alternatively, the common electrode 223 may further include a layer such as ITO, IZO, ZnO and $In_2O_3$ on the transparent (translucent) layer containing the above-described materials. According to an embodiment of the present disclosure, the common electrode 223 may include silver (Ag), magnesium (Mg), or an alloy of silver (Ag) and magnesium (Mg).

The capping layer 230 may be disposed on the common electrode 223. The capping layer 230 may cover and protect the common electrode 223 from above. For example, the capping layer 230 may include an inorganic insulating material or an organic insulating material. Examples of the inorganic insulating material may include aluminum oxide, titanium oxide, tantalum oxide, hafnium oxide, zinc oxide, silicon oxide, silicon nitride, silicon oxynitride, etc. Although the capping layer 230 is formed as a single film in the example shown in FIG. 5, the capping layer 230 may be made up of a stack of multiple films. The refractive index and thickness of the capping layer 230 will be described together with the refractive index and thickness of the encapsulation layer 300.

The auxiliary layer 240 may be disposed on the capping layer 230. The auxiliary layer 240 together with the capping layer 230 may work as optical layers capable of improving the luminous efficiency of the light-emitting elements 220 or controlling viewing angles. According to an embodiment of the present disclosure, the auxiliary layer 240 may include lithium fluoride (LiF), aluminum oxide, titanium oxide, tantalum oxide, hafnium oxide, zinc oxide, silicon oxide, silicon nitride, and/or silicon oxynitride.

According to an embodiment of the present disclosure, the refractive index of the auxiliary layer 240 is smaller than the refractive index of each layer of the first inorganic encapsulation film 310 described later. According to an embodiment of the present disclosure, the refractive index of the auxiliary layer 240 may range from 1.25 to 1.45.

The encapsulation layer 300 may be disposed on the auxiliary layer 240 to cover the plurality of light-emitting elements 220. The encapsulation layer 300 may include a first inorganic encapsulation film 310, an organic encapsulation film 320 and a second inorganic encapsulation film 330 sequentially stacked on the auxiliary layer 240.

The organic encapsulation film 320 may relieve internal stress of the first inorganic encapsulation film 310 and/or the second inorganic encapsulation film 330. The organic encapsulation film 320 may include a polymer-based organic material. Such polymer-based material may include polyethylene terephthalate, polyethylene naphthalate, polycarbonate, polyimide, polyethylene sulfonate, polyoxymethylene, polyarylate, hexamethyldisiloxane (HMDSO), acrylic resins (e.g., polymethyl methacrylate, polyacrylic acid, etc.) or any combination thereof.

The organic encapsulation film 320 may be formed by applying a monomer having flowability and then curing a monomer layer using heat or light such as ultraviolet rays. Alternatively, the organic encapsulation film 320 may be formed by applying the above-described polymer-based material.

The thickness t6 of the organic encapsulation film 320 may be significantly greater than each of the thicknesses of the layers 311, 312, 313, 314 and 315 of the first inorganic encapsulation film 310 thereunder, which will be described later. For example, the thickness t6 of the organic encapsulation film 320 may be approximately 1 micrometer (μm) or more.

The encapsulation layer 300 may include at least one inorganic film to prevent permeation of oxygen or moisture into the light-emitting elements 220. The encapsulation layer 300 may include at least one organic film to protect the light-emitting elements 220 from particles such as dust.

Figure 6:
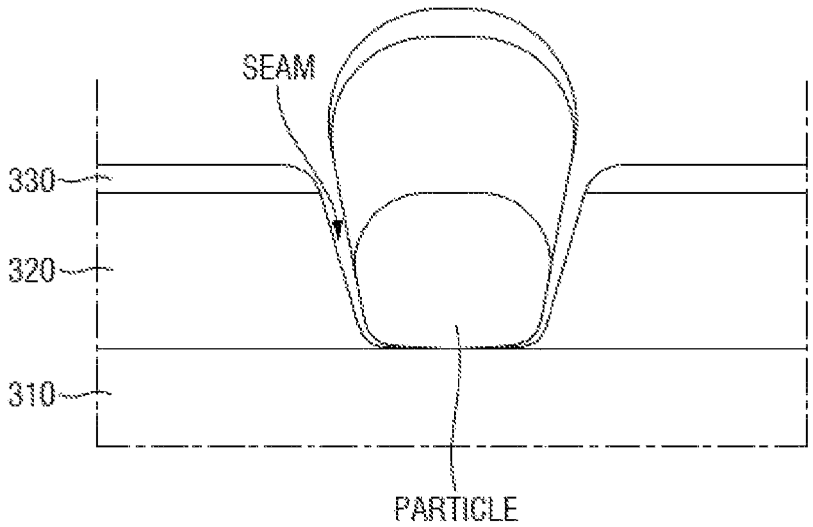
FIG. 6 is a cross-sectional view showing a break created by a particle existing in the encapsulation layer of FIG. 5.

FIG. 6 is a cross-sectional view showing a break created by a particle existing in the encapsulation layer of FIG. 5.

Referring to FIG. 6, if there is a particle in the organic encapsulation film 320, the organic encapsulation film 320 and the second inorganic encapsulation film 330 may not be continuously formed but may be disconnected, and thus a break SEAM may be formed. Oxygen or moisture may permeate from the outside through such a break SEAM. The break SEAM may be formed also in the first inorganic encapsulation film 310 over time, and accordingly moisture or oxygen passes through the first inorganic encapsulation film 310 in addition to the second inorganic encapsulation film 330 and the organic encapsulation film 320. This causes damage to the light-emitting elements and further causes a growing dark spot of the display device. Since particles are inevitably generated in the organic encapsulation film 320 during the processes, it is desirable to make the first inorganic encapsulation film 310 robust against permeation of moisture.

Figure 7:
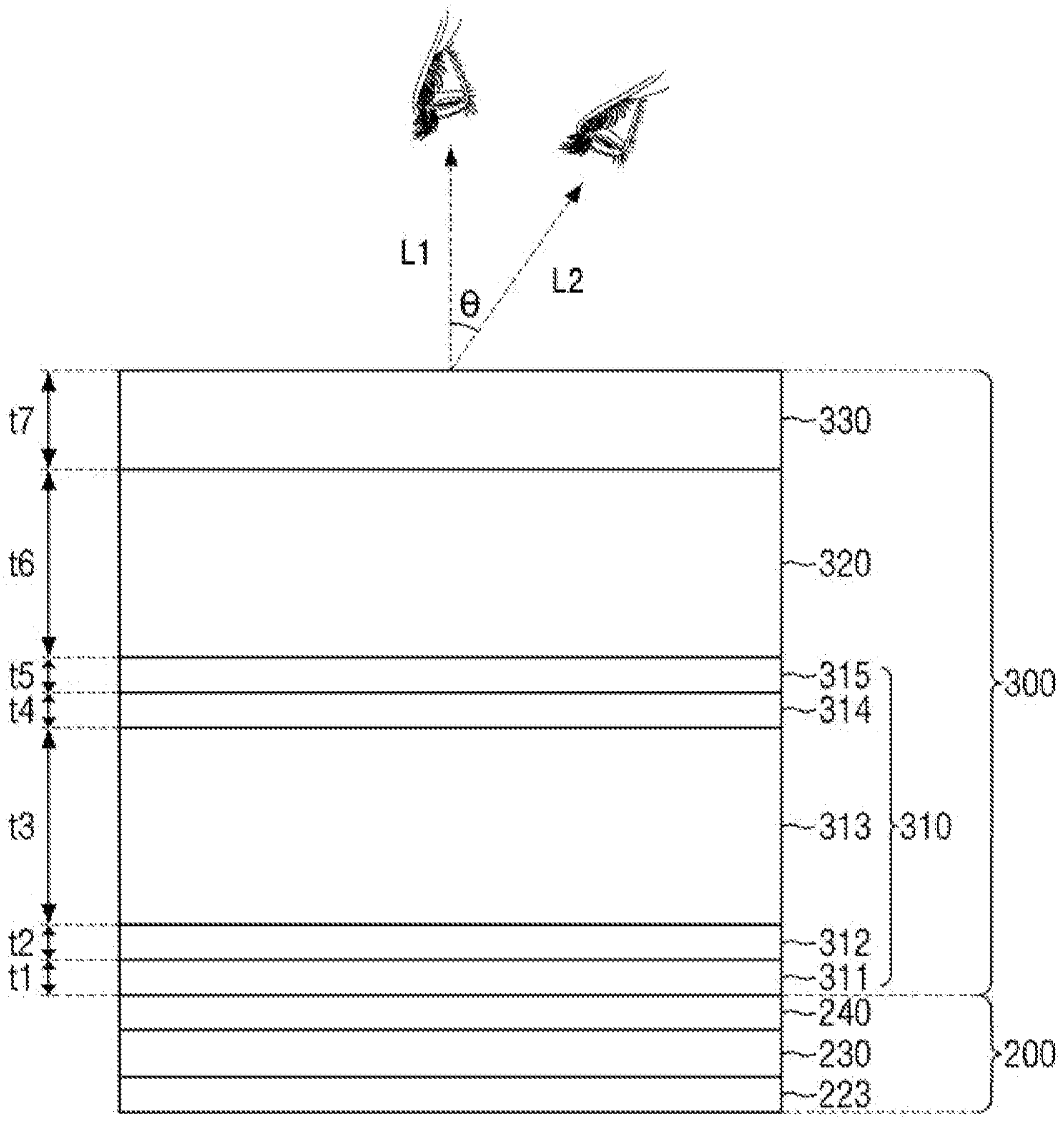
FIG. 7 is a cross-sectional view for illustrating in more detail a stacked structure of a light-emitting element and an encapsulation layer of a display device according to an embodiment.

FIG. 7 is a cross-sectional view for illustrating in more detail a stacked structure of a light-emitting element and an encapsulation layer of a display device according to an embodiment.

Light output from the light-emitting element 220 exits through the common electrode 223, the capping layer 230 and the auxiliary layer 240. As the capping layer 230 and the auxiliary layer 240 have different refractive indices from each other, reflection of light may occur at the interface between the capping layer 230 and the auxiliary layer 240. In the display device 10, optical layers that can reflect lights are disposed on the light-emitting elements 220 using layers having different refractive indices, so that the luminous efficiency (or emission efficiency) and viewing angle of the light-emitting elements 220 can be controlled as desired. The display device 10 may include more optical layers using other layers in addition to the capping layer 230 and the auxiliary layer 240.

The first inorganic encapsulation film 310 may be disposed on the auxiliary layer 240 and disposed between the auxiliary layer 240 and the organic encapsulation film 320. The organic encapsulation film 320 may be disposed on the first inorganic encapsulation film 310 and disposed between the first inorganic encapsulation film 310 and the second inorganic encapsulation film 330. The second inorganic encapsulation film 330 may be disposed on the organic encapsulation film 320.

The first inorganic encapsulation film 310 and the second inorganic encapsulation film 330 may include one or more inorganic insulating materials selected from aluminum oxide, titanium oxide, tantalum oxide, silicon oxide, silicon nitride, and silicon oxynitride. According to some embodiments of the present disclosure, the first inorganic encapsulation film 310 and the second inorganic encapsulation film 330 may include an inorganic insulating layer containing a non-metal element, for example, at least one selected from silicon oxide, silicon nitride, and silicon oxynitride.

According to an embodiment of the present disclosure, the first inorganic encapsulation film 310 may include a plurality of films. The first inorganic encapsulation film 310 may include a first inorganic insulating layer 311, a second inorganic insulating layer 312, a third inorganic insulating layer 313, a fourth inorganic insulating layer 314 and a fifth inorganic insulating layer 315 sequentially disposed on the auxiliary layer 240. By adjusting the refractive index and thickness of each of the capping layer 230, the auxiliary layer 240, and the plurality of stacked films of the first inorganic encapsulation film 310, it is possible to reduce change in luminance and color coordinates according to the user's viewing angle and to obtain a display device that is robust against permeation of moisture.

Hereinafter, the plurality of inorganic insulating layers 311, 312, 313, 314 and 315 of the first inorganic encapsulation film 310 will be described.

Referring to FIG. 7, according to the embodiment there are differences in refractive index between the capping layer 230, the auxiliary layer 240, and adjacent ones of the plurality of films of the first inorganic encapsulation film 310 in the display device, it is possible to reduce changes in luminance and color coordinates according to the user's viewing angle. Light emitted from the light-emitting element 220 may pass through the films of the first inorganic encapsulation film 310 from the capping layer 230 and exit upward. While the light passes through the interfaces between the layers having different refractive indices, the light may be partially reflected and refracted repeatedly. By adjusting the refractive index and thickness of each of the layers disposed on the light-emitting element 220, the emission efficiency and viewing angles of the lights output from the light-emitting element 220 can be controlled as desired.

Incidentally, by precisely forming the differences in refractive index between adjacent layers or films and the thickness of each layer or film as intended, it is possible to prevent change in luminance and color coordinates according to the user's viewing angle θ. As shown in FIG. 7, the viewing angle θ may be defined as an angle between a line L2 extended in a user's gaze direction and a line L1 perpendicular to the upper surface of the second inorganic encapsulation film 330. When a user views the display device in the vertical direction, the viewing angle θ is equal to 0°.

The first inorganic encapsulation film 310 may include first to fifth inorganic insulating layers 311, 312, 313, 314 and 315 disposed directly on the auxiliary layer 240 and disposed between the auxiliary layer 240 and the organic encapsulation film 320.

The refractive index of the first inorganic insulating layer 311 may be greater than the refractive index of the second inorganic insulating layer 312. The refractive index of the first inorganic insulating layer 311 may be greater than the refractive index of the fourth inorganic insulating layer 314. The refractive index of the first inorganic insulating layer 311 may be greater than the refractive index of the fifth inorganic insulating layer 314.

The refractive index of the first inorganic insulating layer 311 may be substantially equal to the refractive index of the third inorganic insulating layer 313.

The first inorganic insulating layer 311 may include silicon nitride (SiNx). Silicon nitride (SiNx) has a high refractive index and is resistant to permeation of moisture and oxygen. The first inorganic insulating layer 311 located at the bottom of the first inorganic encapsulation film 310 may include silicon nitride (SiNx) having a high refractive index, and can prevent permeation of moisture or oxygen into the light-emitting element 220.

The refractive index of the first inorganic insulating layer 311 may be greater than the refractive index of the auxiliary layer 240.

According to an embodiment of the present disclosure, the refractive index of the first inorganic insulating layer 311 may be equal to or greater than 1.80. According to an embodiment of the present disclosure, the refractive index of the first inorganic insulating layer 311 may be equal to or less than 2.0. According to an embodiment of the present disclosure, the refractive index of the first inorganic insulating layer 311 may range from 1.85 to 1.95. According to an embodiment of the present disclosure, the refractive index of the first inorganic insulating layer 311 may be equal to 1.89. When the first inorganic insulating layer 311 contains silicon nitride, the refractive index may be adjusted by adjusting the content of nitrogen. For example, by increasing the content of nitrogen in the first inorganic insulating layer 311, the refractive index of the first inorganic insulating layer 311 is increased. When the refractive index of the first inorganic insulating layer 311 lies within the above range, it is possible to prevent permeation of moisture into the auxiliary layer 240 and reduce changes in luminance and color coordinates according to the viewing angle.

Herein, the refractive indices may be measured using an optical measuring instrument such as an ellipsometer and a spectral reflectometer. The ellipsometer may measure the refractive index by measuring the amounts of polarization changes of the incident light and the reflected light with respect to an inorganic film to calculate the thickness and complex refractive index of the inorganic film. The spectral reflectometer may measure the refractive index of an inorganic film by comparing the intensities of lights obtained by varying the wavelength. The refractive index may be a value measured at room temperature and normal pressure.

According to an embodiment of the present disclosure, the thickness t1 of the first inorganic insulating layer 311 may range from about 500 Å to about 2,000 Å. According to an embodiment of the present disclosure, the thickness t1 of the first inorganic insulating layer 311 may range from about 1,000 Å to about 1,500 Å. According to an embodiment of the present disclosure, the thickness t1 of the first inorganic insulating layer 311 may be about 1,300 Å. If the thickness t1 of the first inorganic insulating layer 311 exceeds about 2,000 Å, the tact time for forming the first inorganic insulating layer 311 on the auxiliary layer 240 becomes longer. If the thickness of the first inorganic insulating layer 311 is less than about 500 Å, it is difficult to prevent permeation of moisture.

According to an embodiment of the present disclosure, the thickness t1 of the first inorganic insulating layer 311 is greater than the thickness t2 of the second inorganic insulating layer 312. According to an embodiment of the present disclosure, the thickness t1 of the first inorganic insulating layer 311 is smaller than the thickness t3 of the third inorganic insulating layer 313. According to an embodiment of the present disclosure, the thickness t1 of the first inorganic insulating layer 311 is greater than the thickness t4 of the fourth inorganic insulating layer 314. According to an embodiment of the present disclosure, the thickness t1 of the first inorganic insulating layer 311 is greater than the thickness t5 of the fifth inorganic insulating layer 315.

The refractive index of the second inorganic insulating layer 312 may be smaller than the refractive index of the first inorganic insulating layer 311. The refractive index of the second inorganic insulating layer 312 may be smaller than the refractive index of the third inorganic insulating layer 313. The refractive index of the second inorganic insulating layer 312 may be greater than the refractive index of the fourth inorganic insulating layer 314. The refractive index of the second inorganic insulating layer 312 may be greater than the refractive index of the fifth inorganic insulating layer 315.

The second inorganic insulating layer 312 may include silicon oxynitride (SiOxNy). Silicon oxynitride (SiOxNy) has a relatively low refractive index compared to silicon nitride (SiNx) and is vulnerable to permeation of moisture and oxygen. When the second inorganic insulating layer 312 disposed between the first inorganic insulating layer 311 and the third inorganic insulating layer 313 having high refractive indices has a relatively low refractive index, it is possible to reduce differences in colors on the screen when viewed at different viewing angles.

The refractive index of the second inorganic insulating layer 312 may be greater than the refractive index of the auxiliary layer 240.

According to an embodiment of the present disclosure, the refractive index of the second inorganic insulating layer 312 may be equal to or greater than 1.70. According to an embodiment of the present disclosure, the refractive index of the second inorganic insulating layer 312 may be equal to or less than 1.90. According to an embodiment of the present disclosure, the refractive index of the second inorganic insulating layer 312 may range from 1.70 to 1.80. According to an embodiment of the present disclosure, the refractive index of the second inorganic insulating layer 312 may be equal to 1.77. When the second inorganic insulating layer 312 contains silicon oxynitride, the refractive index may be adjusted by adjusting the contents of oxygen and nitrogen. When the content of oxygen is decreased while the content of nitrogen is increased, the refractive index is increased. When the refractive index of the second inorganic insulating layer 312 lies within the above range, it is possible to reduce changes in luminance and color coordinates according to the viewing angle.

According to an embodiment of the present disclosure, the thickness t2 of the second inorganic insulating layer 312 may range from about 500 Å to about 2,000 Å. According to an embodiment of the present disclosure, the thickness t2 of the second inorganic insulating layer 312 may range from about 500 Å to about 1,000 Å. According to an embodiment of the present disclosure, the thickness t2 of the second inorganic insulating layer 312 may be about 700 Å.

The refractive index of the third inorganic insulating layer 313 may be greater than the refractive index of the second inorganic insulating layer 312. The refractive index of the third inorganic insulating layer 313 may be greater than the refractive index of the fourth inorganic insulating layer 314. The refractive index of the third inorganic insulating layer 313 may be greater than the refractive index of the fifth inorganic insulating layer 315.

The refractive index of the third inorganic insulating layer 313 may be substantially equal to the refractive index of the first inorganic insulating layer 311.

The third inorganic insulating layer 313 may include silicon nitride (SiNx). Silicon nitride (SiNx) of the first inorganic insulating layer 311 and the third inorganic insulating layer 313 may have substantially the same nitrogen content. When the third inorganic insulating layer 313 as well as the first inorganic insulating layer 311 includes silicon nitride (SiNx) having a high refractive index, it is possible to effectively prevent moisture or oxygen from permeating into the light-emitting element 220.

The refractive index of the third inorganic insulating layer 313 may be greater than the refractive index of the auxiliary layer 240.

According to an embodiment of the present disclosure, the refractive index of the third inorganic insulating layer 313 may be equal to or greater than 1.80. According to an embodiment of the present disclosure, the refractive index of the third inorganic insulating layer 313 may be equal to or less than 2.0. According to an embodiment of the present disclosure, the refractive index of the third inorganic insulating layer 313 may range from 1.85 to 1.95. According to an embodiment of the present disclosure, the refractive index of the third inorganic insulating layer 313 may be equal to 1.89. When the refractive index of the third inorganic insulating layer 313 lies within the above range, it is possible to prevent permeation of moisture into the first inorganic insulating layer 311 and the second inorganic insulating layer 312 thereunder and reduce changes in luminance and color coordinates according to the viewing angle.

According to an embodiment of the present disclosure, the thickness t3 of the third inorganic insulating layer 313 may range from about 6,000 Å to about 9,000 Å. According to an embodiment of the present disclosure, the thickness t3 of the third inorganic insulating layer 313 may range from about 6,500 Å to about 8,000 Å. According to an embodiment of the present disclosure, the thickness t3 of the third inorganic insulating layer 313 may be about 7,000 Å.

According to an embodiment of the present disclosure, the thickness t3 of the third inorganic insulating layer 313 may be 1.5 to 2.5 times the thickness t7 of the second inorganic encapsulation film 330. According to an embodiment of the present disclosure, the thickness t3 of the third inorganic insulating layer 313 may be greater than the sum of thicknesses t1, t2, t4 and t5 of the first inorganic insulating layer 311, the second inorganic insulating layer 312, the fourth inorganic insulating layer 314 and the fifth inorganic insulating layer 315.

The third inorganic insulating layer 313 may be a layer of the first inorganic encapsulation film 310 that is relatively less affected by the optical properties, and may be a layer for ensuring reliability such as prevention of moisture permeation and oxidation. Therefore, the thickness t3 of the third inorganic insulating layer 313 may be greater than each or the sum of the thicknesses of the other layers of the first inorganic encapsulation film.

For the third inorganic insulating layer 313 formed of silicon nitride (SiNix), it is more effective to block moisture and oxygen permeating from the outside as the thickness increases. By virtue of the third inorganic insulating layer 313, the effect of preventing moisture permeation and oxidation of the first inorganic encapsulation film 310 can be greatly increased, and the light-emitting element 220 can withstand moisture permeation caused by particles for a long time.

The refractive index of the fourth inorganic insulating layer 314 may be smaller than the refractive index of the first inorganic insulating layer 311. The refractive index of the fourth inorganic insulating layer 314 may be smaller than the refractive index of the second inorganic insulating layer 312. The refractive index of the fourth inorganic insulating layer 314 may be smaller than the refractive index of the third inorganic insulating layer 313. The refractive index of the fourth inorganic insulating layer 314 may be greater than the refractive index of the fifth inorganic insulating layer 315.

The fourth inorganic insulating layer 314 may include silicon oxynitride (SiOxNy). Silicon oxynitride of the fourth inorganic insulating layer 314 may have a higher oxygen content than silicon oxynitride of the second inorganic insulating layer 312. Silicon oxynitride of the fourth inorganic insulating layer 314 may have a lower oxygen content than silicon oxynitride of the fifth inorganic insulating layer 315.

The refractive index of the fourth inorganic insulating layer 314 may be greater than the refractive index of the auxiliary layer 240.

According to an embodiment of the present disclosure, the refractive index of the fourth inorganic insulating layer 314 may be equal to or less than 1.70. According to an embodiment of the present disclosure, the refractive index of the fourth inorganic insulating layer 314 may be equal to or less than 1.50. According to an embodiment of the present disclosure, the refractive index of the fourth inorganic insulating layer 314 may range from 1.55 to 1.65. According to an embodiment of the present disclosure, the refractive index of the fourth inorganic insulating layer 314 may be equal to 1.62.

According to an embodiment of the present disclosure, the thickness t4 of the fourth inorganic insulating layer 314 may range from about 500 Å to about 1,000 Å. According to an embodiment of the present disclosure, the thickness t4 of the fourth inorganic insulating layer 314 may range from about 700 Å to about 9,000 Å. According to an embodiment of the present disclosure, the thickness t4 of the fourth inorganic insulating layer 314 may be about 800 Å.

The refractive index of the fifth inorganic insulating layer 315 may be smaller than the refractive index of the first inorganic insulating layer 311. The refractive index of the fifth inorganic insulating layer 315 may be smaller than the refractive index of the second inorganic insulating layer 312. The refractive index of the fifth inorganic insulating layer 315 may be smaller than the refractive index of the third inorganic insulating layer 313. The refractive index of the fifth inorganic insulating layer 315 may be smaller than the refractive index of the fourth inorganic insulating layer 314.

The fifth inorganic insulating layer 315 may include silicon oxynitride (SiOxNy). Silicon oxynitride of the fifth inorganic insulating layer 315 may have a higher oxygen content than silicon oxynitride of the second inorganic insulating layer 312. Silicon oxynitride of the fifth inorganic insulating layer 315 may have a higher oxygen content than silicon oxynitride of the fourth inorganic insulating layer 314.

The refractive index of the fifth inorganic insulating layer 315 may be greater than the refractive index of the auxiliary layer 240.

According to an embodiment of the present disclosure, the refractive index of the fifth inorganic insulating layer 315 may be equal to or less than 1.60. According to an embodiment of the present disclosure, the refractive index of the fifth inorganic insulating layer 315 may be equal to or greater than 1.40. According to an embodiment of the present disclosure, the refractive index of the fifth inorganic insulating layer 315 may range from 1.50 to 1.60. According to an embodiment of the present disclosure, the refractive index of the fifth inorganic insulating layer 315 may be equal to 1.57.

According to an embodiment of the present disclosure, the thickness t5 of the fifth inorganic insulating layer 315 may range from about 500 Å to about 1,000 Å. According to an embodiment of the present disclosure, the thickness t5 of the fifth inorganic insulating layer 315 may range from about 700 Å to about 9,000 Å. According to an embodiment of the present disclosure, the thickness t5 of the fifth inorganic insulating layer 315 may be about 800 Å.

The second inorganic encapsulation film 330 may include an inorganic insulating material. According to an embodiment of the present disclosure, the second inorganic encapsulation layer may include silicon nitride (SiNx). Although the second inorganic encapsulation film 330 is a single-layer structure in the example shown in FIG. 7, it may have a multi-layer structure.

According to an embodiment of the present disclosure, the second inorganic encapsulation film 330 may be a single layer and may include silicon nitride (SiNx). Silicon nitride (SiNx) of the first inorganic insulating layer 311, the third inorganic insulating layer 313 and the second inorganic encapsulation film 330 may have substantially the same nitrogen content. The first inorganic insulating layer 311, the third inorganic insulating layer 313 and the second inorganic encapsulation film 330 may be substantially the same refractive index.

According to an embodiment of the present disclosure, the refractive index of the second inorganic encapsulation film 330 may be equal to or greater than 1.80. According to an embodiment of the present disclosure, the refractive index of the second inorganic encapsulation film 330 may be equal to or less than 2.0. According to an embodiment of the present disclosure, the refractive index of the second inorganic encapsulation film 330 may range from 1.85 to 1.95. According to an embodiment of the present disclosure, the refractive index of the second inorganic encapsulation film 330 may be equal to 1.89.

According to an embodiment of the present disclosure, the thickness t7 of the second inorganic encapsulation film 330 may range from about 3,000 Å to about 8,000 Å. According to an embodiment of the present disclosure, the thickness t7 of the second inorganic encapsulation film 330 may range from about 3,000 Å to about 6,000 Å. According to an embodiment of the present disclosure, the thickness t7 of the second inorganic encapsulation film 330 may be equal to about 4,000 Å. When the thickness t7 of the second inorganic encapsulation film 330 lies within the above range, it is possible to primarily prevent foreign substances and moisture from intruding from the outside.

In the display device 10 according to an embodiment, the third inorganic insulating layer 313 of the first inorganic encapsulation film 310 includes silicon nitride (SiNix) and has a relatively large thickness to greatly increase the effect of preventing moisture permeation. Even if the organic encapsulation film 320 and the second inorganic encapsulation film 330 are damaged due to permeation of moisture, the first inorganic encapsulation film 310 can have durability against moisture and oxygen.

Figure 8:
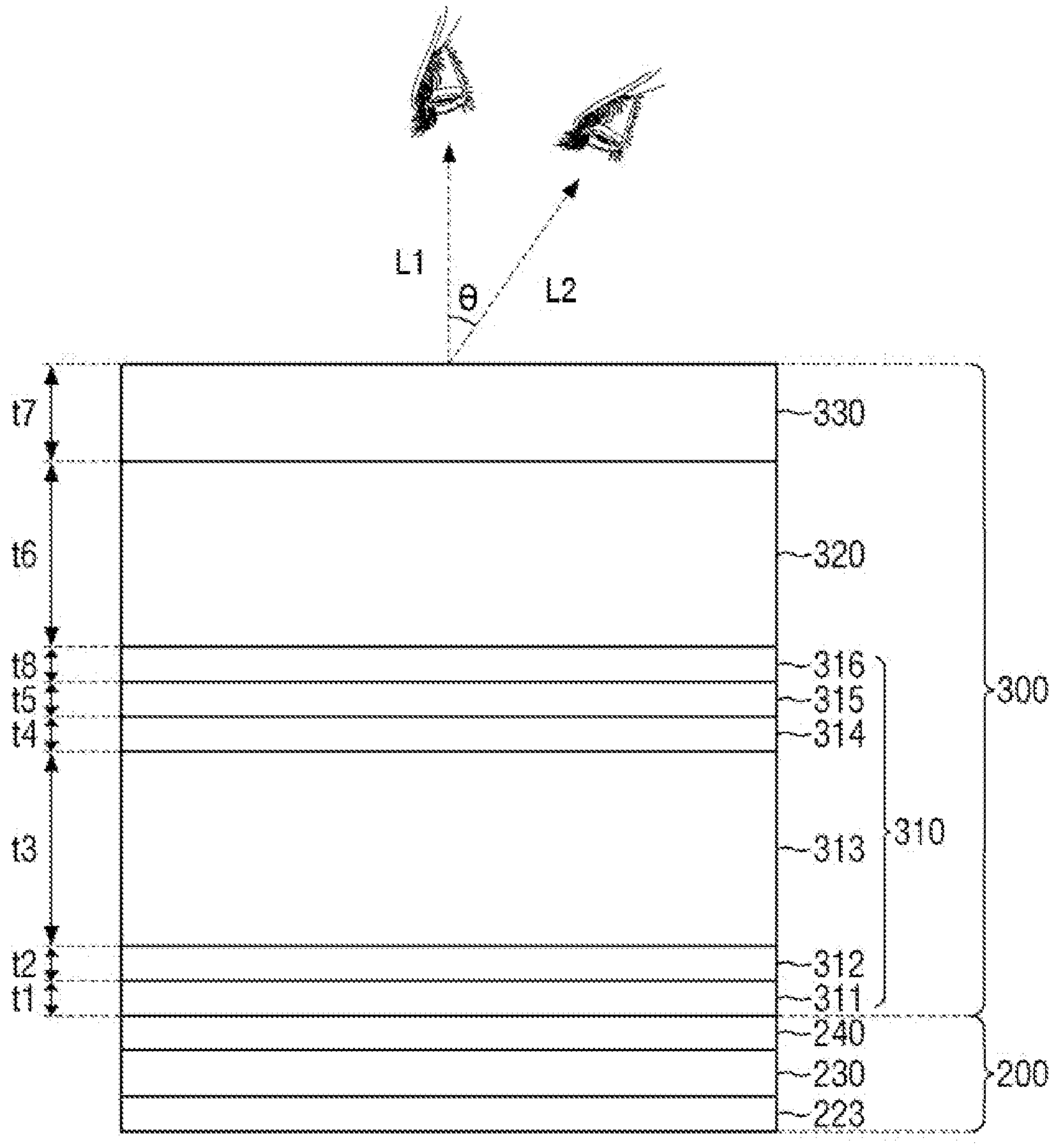
FIG. 8 is a cross-sectional view showing in more detail a stacked structure of a light-emitting element and an encapsulation layer of a display device according to another embodiment.

A display device according to yet another embodiment of FIG. 8 is substantially identical to the display device according to the embodiment of FIG. 7 except that a first inorganic encapsulation film 310 further includes a sixth inorganic insulating layer 316 on a fifth inorganic insulating layer 315; and, therefore, the redundant descriptions will be omitted.

The refractive index of the sixth inorganic insulating layer 316 may be smaller than the refractive index of the fifth inorganic insulating layer 315. The refractive index of the sixth inorganic insulating layer 316 may be smaller than the refractive index of the fourth inorganic insulating layer 314. The refractive index of the sixth inorganic insulating layer 316 may be smaller than the refractive index of the third inorganic insulating layer 313. The refractive index of the sixth inorganic insulating layer 316 may be smaller than the refractive index of the second inorganic insulating layer 312. The refractive index of the sixth inorganic insulating layer 316 may be smaller than the refractive index of the first inorganic insulating layer 311.

The sixth inorganic insulating layer 316 may include silicon oxynitride (SiOxNy). Silicon oxynitride of the sixth inorganic insulating layer 316 may have a higher oxygen content than silicon oxynitride of the second inorganic insulating layer 312. Silicon oxynitride of the sixth inorganic insulating layer 316 may have a higher oxygen content than silicon oxynitride of the fourth inorganic insulating layer 314. Silicon oxynitride of the sixth inorganic insulating layer 316 may have a higher oxygen content than silicon oxynitride of the fifth inorganic insulating layer 315.

The refractive index of the sixth inorganic insulating layer 316 may be greater than the refractive index of the auxiliary layer 240.

According to an embodiment of the present disclosure, the refractive index of the sixth inorganic insulating layer 316 may be equal to or less than 1.60. According to an embodiment of the present disclosure, the refractive index of the sixth inorganic insulating layer 316 may be equal to or greater than 1.40. According to an embodiment of the present disclosure, the refractive index of the sixth inorganic insulating layer 316 may range from 1.50 to 1.60. According to an embodiment of the present disclosure, the refractive index of the sixth inorganic insulating layer 316 may be equal to 1.53.

According to an embodiment of the present disclosure, the thickness t8 of the sixth inorganic insulating layer 316 may range from about 500 Å to about 1,000 Å. According to an embodiment of the present disclosure, the thickness t8 of the sixth inorganic insulating layer 316 may range from about 700 Å to about 9,000 Å. According to an embodiment of the present disclosure, the thickness t8 of the sixth inorganic insulating layer 316 may be about 800 Å.

In the display device 10, the thicknesses of the capping layer 230, the auxiliary layer 240, the plurality of inorganic insulating layers 311, 312, 313, 314 and 315 of the first inorganic encapsulation film 310, the organic encapsulation film 320 and the second inorganic encapsulation film 330 may be designed within a particular range depending on optical characteristics, reliability, tact time, etc. In an inorganic insulating layer, as the refractive index is higher and the thickness is larger, the reliability against permeation of moisture can be improved, but the tact time may increase, the optical absorption may increase, and deviations in the thickness may increase. In particular, if the length of the optical cavity increases, it may be difficult to ensure resonance characteristics as the optical path is longer than the coherent length or a high-order resonance is used. Moreover, since the final optical characteristics vary depending on the spectrum of light as the light passes through the plurality of layers in the display device 10, it may be required to precisely adjust the thickness and the refractive index of the inorganic insulating layer to adjust the resonance characteristics for different wavelengths depending on the material of the inorganic insulating layer.

As a plurality of layers having different refractive indices is sequentially stacked on one another, an interface where light can be refracted or reflected may be formed at the surfaces between the capping layer 230, the auxiliary layer 240, and the first to fifth inorganic insulating layers 311, 312, 313, 314 and 315 in contact with each other. In particular, the first to fifth inorganic insulating layers 311, 312, 313, 314 and 315 include silicon nitride (SiNx) and silicon oxynitride (SiOxNy) and have different refractive indices, so that it is possible to form a plurality of reflective interfaces along with the capping layer 230 and the auxiliary layer SPL. As described above, the display device 10 according to the embodiment can prevent a change to blue color as a user's viewing angle increases by precisely adjusting differences in refractive index between adjacent layers or films. In addition, the display device 10 according to the embodiment can have strong resistance to permeation of moisture and oxidation.

Hereinafter, how to reduce change in luminance and color coordinates according to the viewing angle on the color coordinates ("CIE") through the stack structure of the capping layer 230, the auxiliary layer 240, the first to fifth inorganic insulating layers 311, 312, 313, 314 and 315, the organic encapsulation film 320 and the second inorganic encapsulation film 33 according to an embodiment of the present disclosure will be described.

Figure 9:
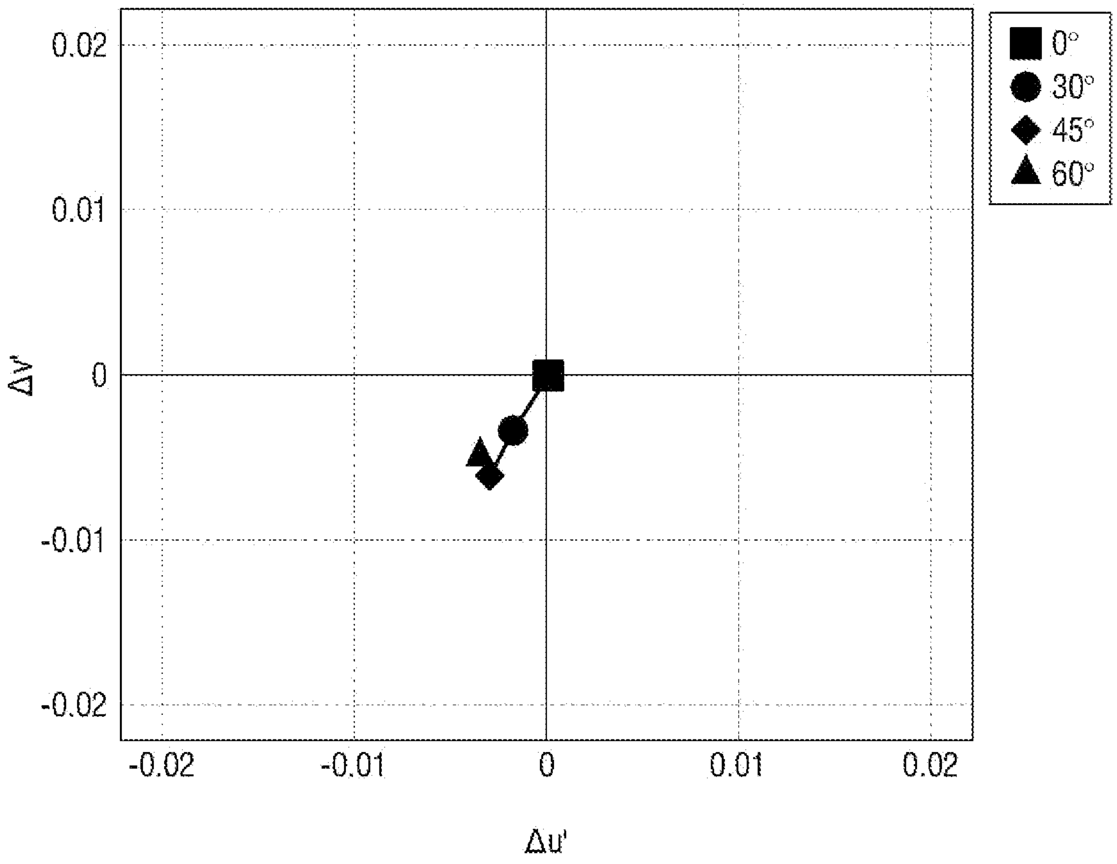
FIG. 9 is a graph showing the amount of change Δu' of a first component and the amount of change Δv' of a second component according to viewing angle on color coordinates.

FIG. 9 is a graph showing the amount of change Δu' of a first component and the amount of change Δv' of a second component according to viewing angle on color coordinates.

The graph of FIG. 9 is color coordinates (CIE diagram) of the visible light range well known in the art. The horizontal axis represents the amount of change Δu' of the first component, the vertical axis represents the amount of change Δv' of the second component, and the amount of change Δu' of the first component and the amount of change Δv' of the second component are zero at the origin. Color coordinates at viewing angles of 0°, 30°, 45°, and 60° are shown in FIG. 9.

In the color coordinates at the viewing angle of 0°, each of the amount of change Δu' of the first component and the amount of change Δv' of the second component is 0. In the color coordinates at the viewing angle of 30°, the amount of change Δu' of the first component is approximately −0.002 and the amount of change Δv' of the second component is approximately −0.0025. In the color coordinates at the viewing angle of 45°, the amount of change Δu' of the first component is approximately −0.004 and the amount of change Δv' of the second component is approximately −0.0055. In the color coordinates at the viewing angle of 60°, the amount of change Δu' of the first component is approximately −0.0045 and the amount of change Δv' of the second component is approximately −0.005.

At the viewing angles of 30°, 45° and 60°, the amount of change Δu' of the first component and the amount of change Δv' of the second component have negative values. When the color coordinates are measured sequentially at the viewing angles from 0° to 30° and from 30° to 45°, the amount of change Δu' of the first component and the amount of change Δv' of the second component are decreasing. When the color coordinates are measured at the viewing angle from 45° to 60°, the amount of change Δu' of the first component may decrease while the amount of change Δv' of the second component may increase.

It can be seen from the color coordinates (CIE) that the amount of change Δu' of the first component and the amount of change Δv' of the second component tend to represent white color as they approach the origin where the amounts are zero. In particular, when the viewing angle is greater than 0°, the blue component increases in the recognized light in the third quadrant of the color coordinates in which the amount of change Δu' and the amount of change Δv' have negative values away from the origin at the viewing angles 30°, 45° and 60°.

However, according to this embodiment, although the color coordinates are measured sequentially at the viewing angles from 0° to 30° and from 30° to 45°, the amount of change Δu' and the amount of change Δv' decrease and the distance from the origin increases, when the color coordinates are measured at the viewing angle from 45° to 60°, the distance from the origin decreases, and accordingly it is possible to prevent change to blue color as the viewing angle increases from 45°.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:

a light-emitting element disposed on a substrate and comprising a first electrode, an emissive layer, and a second electrode;

a first inorganic encapsulation film disposed on the second electrode of the light-emitting element;

an organic encapsulation film disposed on the first inorganic encapsulation film; and a second inorganic encapsulation film disposed on the organic encapsulation film, wherein the first inorganic encapsulation film comprises a first inorganic insulating layer on the second electrode of the light-emitting element, a second inorganic insulating layer on the first inorganic insulating layer, a third inorganic insulating layer on the second inorganic insulating layer, a fourth inorganic insulating layer on the third inorganic insulating layer, and a fifth inorganic insulating layer on the fourth inorganic insulating layer, wherein a refractive index of the first inorganic insulating layer is greater than a refractive index of the second inorganic insulating layer, wherein the refractive index of the second inorganic insulating layer is smaller than a refractive index of the third inorganic insulating layer, wherein the refractive index of the third inorganic insulating layer is greater than a refractive index of the fourth inorganic insulating layer, and wherein the refractive index of the second inorganic insulating layer is greater than the refractive index of the fourth inorganic insulating layer.

2. The display device of claim 1, wherein the refractive index of the fourth inorganic insulating layer is greater than a refractive index of the fifth inorganic insulating layer.

3. The display device of claim 1, further comprising:

an auxiliary layer disposed between the second electrode and the first inorganic insulating layer, wherein the refractive index of the first inorganic insulating layer is greater than a refractive index of the auxiliary layer.

4. The display device of claim 3, wherein the organic encapsulation film comprises an organic polymer, and wherein the auxiliary layer is made of lithium fluoride (LiF).

5. The display device of claim 1, wherein a thickness of the third inorganic insulating layer is 1.5 to 2.5 times a thickness of the second inorganic encapsulation film.

6. The display device of claim 1, wherein a thickness of the third inorganic insulating layer is greater than a sum of thicknesses of the first inorganic insulating layer, the second inorganic insulating layer, the fourth inorganic insulating layer and the fifth inorganic insulating layer.

7. The display device of claim 1, wherein each of the first inorganic insulating layer, the third inorganic insulating layer and the second inorganic encapsulation film comprises silicon nitride ($SiN_x$).

8. The display device of claim 7, wherein the first inorganic insulating layer, the third inorganic insulating layer and the second inorganic encapsulation film have a same refractive index.

9. The display device of claim 1, wherein each of the second inorganic insulating layer, the fourth inorganic insulating layer and the fifth inorganic insulating layer comprises silicon oxynitride ($SiO_xN_y$).

10. The display device of claim 1, wherein each of the refractive indices of the first inorganic insulating layer and the third inorganic insulating layer is equal to or greater than 1.80, wherein a thickness of the first inorganic insulating layer ranges from about 500 angstroms (Å) to about 2,000 Å, and wherein a thickness of the third inorganic insulating layer ranges from about 6,000 Å to about 9,000 Å.

11. The display device of claim 1, wherein the refractive index of the second inorganic insulating layer is equal to or greater than 1.70, and wherein the refractive index of the fourth inorganic insulating layer is equal to or less than 1.70.

12. The display device of claim 11, wherein a thickness of the second inorganic insulating layer ranges from about 500 Å to about 2,000 Å, and wherein a thickness of the fourth inorganic insulating layer ranges from about 500 Å to about 1,000 Å.

13. The display device of claim 1, wherein a refractive index of the fifth inorganic insulating layer is equal to or less than 1.6, and wherein a thickness of the fifth inorganic insulating layer ranges from about 500 Å to about 1,000 Å.

14. The display device of claim 1, wherein the first inorganic encapsulation film further comprises a sixth inorganic insulating layer on the fifth inorganic insulating layer, and wherein a refractive index of the sixth inorganic insulating layer is smaller than a refractive index of the fifth inorganic insulating layer.

15. The display device of claim 1, wherein a thickness of the second inorganic encapsulation film ranges from is about 3,000 Å to about 8,000 Å.

16. A display device comprising:

a light-emitting element disposed on a substrate and comprising a first electrode, an emissive layer, and a second electrode;

a first inorganic encapsulation film disposed on light-emitting element;

an organic encapsulation film disposed on the first inorganic encapsulation film; and a second inorganic encapsulation film disposed on the organic encapsulation film, wherein the first inorganic encapsulation film comprises a first inorganic insulating layer on the second electrode, a second inorganic insulating layer on the first inorganic insulating layer, a third inorganic insulating layer on the second inorganic insulating layer, a fourth inorganic insulating layer on the third inorganic insulating layer, and a fifth inorganic insulating layer on the fourth inorganic insulating layer, wherein each of the first inorganic insulating layer, the third inorganic insulating layer and the second inorganic encapsulation film comprises silicon nitride ($SiN_x$), and wherein a thickness of the third inorganic insulating layer is greater than a thickness of the second inorganic encapsulation film.

17. The display device of claim 16, wherein the thickness of the third inorganic insulating layer is greater than a sum of thicknesses of the first inorganic insulating layer, the second inorganic insulating layer, the fourth inorganic insulating layer and the fifth inorganic insulating layer.

18. The display device of claim 16, wherein the second inorganic insulating layer, the fourth inorganic insulating layer and the fifth inorganic insulating layer comprises silicon oxynitride ($SiON_x$).

19. The display device of claim 16, wherein a refractive index of the first inorganic insulating layer is greater than a refractive index of the second inorganic insulating layer, the refractive index of the second inorganic insulating layer is smaller than a refractive index of the third inorganic insulating layer, the refractive index of the second inorganic insulating layer is greater than a refractive index of the fourth inorganic insulating layer, and the refractive index of the third inorganic insulating layer is greater than the refractive index of the fourth inorganic insulating layer, wherein the refractive index of each of the first inorganic insulating layer and the third inorganic insulating layer is equal to or greater than 1.80, wherein the refractive index of the second inorganic insulating layer is equal to or greater than 1.70, and wherein the refractive index of the fourth inorganic insulating layer is equal to or less than 1.70.

20. The display device of claim 19, wherein the refractive index of the fourth inorganic insulating layer is greater than a refractive index of the fifth inorganic insulating layer, and wherein the refractive index of the fifth inorganic insulating layer is equal to or less than 1.6.

* * * * *